(12) United States Patent
Miller

(10) Patent No.: US 9,711,679 B2
(45) Date of Patent: Jul. 18, 2017

(54) FRONT-SIDE EMITTING MID-INFRARED LIGHT EMITTING DIODE FABRICATION METHODS

(71) Applicant: Terahertz Device Corporation, Salt Lake City, UT (US)

(72) Inventor: Mark S. Miller, Salt Lake City, UT (US)

(73) Assignee: Terahertz Device Corporation, Salt Lake City, UT (US)

( * ) Notice: Subject to any disclaimer, the term of this patent is extended or adjusted under 35 U.S.C. 154(b) by 0 days.

(21) Appl. No.: 14/645,025

(22) Filed: Mar. 11, 2015

(65) Prior Publication Data

US 2015/0263218 A1    Sep. 17, 2015

Related U.S. Application Data

(60) Provisional application No. 61/951,411, filed on Mar. 11, 2014.

(51) Int. Cl.

| | |
|---|---|
| *H01L 21/00* | (2006.01) |
| *H01L 33/00* | (2010.01) |
| *H01L 23/00* | (2006.01) |
| *H01L 33/40* | (2010.01) |
| *H01L 33/46* | (2010.01) |
| *H01L 33/04* | (2010.01) |

(52) U.S. Cl.
CPC .......... *H01L 33/0062* (2013.01); *H01L 24/05* (2013.01); *H01L 33/0079* (2013.01); *H01L 33/04* (2013.01); *H01L 33/40* (2013.01); *H01L 33/46* (2013.01); *H01L 2224/4847* (2013.01); *H01L 2933/0016* (2013.01); *H01L 2933/0025* (2013.01)

(58) Field of Classification Search
CPC . H01L 33/0062; H01L 24/05; H01L 33/0079; H01L 33/04; H01L 2933/0016; H01L 2933/0025; H01L 33/40; H01L 33/46
USPC .......................................................... 438/27
See application file for complete search history.

(56) References Cited

U.S. PATENT DOCUMENTS

| | | | | |
|---|---|---|---|---|
| 4,618,398 | A | * | 10/1986 | Nawata ............ H01L 21/32136 204/192.35 |
| 4,829,343 | A | * | 5/1989 | Levi ...................... H01L 29/155 257/198 |
| 5,779,924 | A | * | 7/1998 | Krames .................. H01L 33/20 216/24 |
| 5,923,045 | A | * | 7/1999 | Nihashi ..................... H01J 1/34 257/10 |

(Continued)

OTHER PUBLICATIONS

Koerperick, E "High power mid-wave and long-wave infrared light emitting diodes: device growth and applications" Jul. 2009, 62 pages. University of Iowa Dissertation.

(Continued)

*Primary Examiner* — Phat X Cao
*Assistant Examiner* — Mohammad M Hoque
(74) *Attorney, Agent, or Firm* — Ray Quinney & Nebeker, P.C.; Paul N. Taylor

(57) ABSTRACT

Methods for fabricating mid-infrared light emitting diodes (LEDs) based upon antimonide-arsenide semiconductor heterostructures and configured into front-side emitting high-brightness LED die and other LED die formats.

20 Claims, 8 Drawing Sheets

(56) References Cited

U.S. PATENT DOCUMENTS

| | | | |
|---|---|---|---|
| 6,301,283 B1* | 10/2001 | Chen | H01S 5/12 |
| | | | 372/46.01 |
| 7,294,862 B2* | 11/2007 | Wierer, Jr. | B82Y 20/00 |
| | | | 257/94 |
| 8,039,847 B2 | 10/2011 | Nuzzo et al. | |
| 8,811,442 B2* | 8/2014 | Schulz | B82Y 20/00 |
| | | | 372/43.01 |
| 2002/0028390 A1* | 3/2002 | Mazed | G02B 6/4249 |
| | | | 430/5 |
| 2002/0070390 A1* | 6/2002 | Chow | H01L 29/155 |
| | | | 257/197 |
| 2005/0087753 A1* | 4/2005 | D'Evelyn | C30B 9/00 |
| | | | 257/98 |
| 2005/0253222 A1* | 11/2005 | Caneau | B82Y 20/00 |
| | | | 257/607 |
| 2007/0032089 A1* | 2/2007 | Nuzzo | H01L 21/02628 |
| | | | 438/725 |
| 2007/0034852 A1* | 2/2007 | Nelson | B82Y 20/00 |
| | | | 257/13 |
| 2007/0228385 A1* | 10/2007 | Cao | H01L 33/32 |
| | | | 257/79 |
| 2008/0073641 A1* | 3/2008 | Cheng | B82Y 10/00 |
| | | | 257/25 |
| 2008/0128728 A1* | 6/2008 | Nemchuk | G02F 1/133603 |
| | | | 257/98 |
| 2008/0240174 A1* | 10/2008 | Brueck | B82Y 20/00 |
| | | | 372/20 |
| 2009/0121250 A1* | 5/2009 | DenBaars | H01L 33/54 |
| | | | 257/98 |
| 2009/0224228 A1* | 9/2009 | Razeghi | B82Y 20/00 |
| | | | 257/21 |
| 2009/0224229 A1* | 9/2009 | Razeghi | H01L 31/0304 |
| | | | 257/21 |
| 2011/0095291 A1* | 4/2011 | Quitoriano | C30B 25/02 |
| | | | 257/52 |
| 2012/0032212 A1* | 2/2012 | Huang | H01L 21/2654 |
| | | | 257/98 |
| 2012/0138891 A1* | 6/2012 | Chung | H01L 33/06 |
| | | | 257/13 |
| 2012/0145996 A1* | 6/2012 | Ting | B82Y 20/00 |
| | | | 257/21 |
| 2012/0273043 A1* | 11/2012 | Lochtefeld | H01L 31/06875 |
| | | | 136/261 |
| 2013/0153856 A1* | 6/2013 | Das | H01L 33/0079 |
| | | | 257/13 |
| 2013/0248821 A1* | 9/2013 | Miura | B82Y 20/00 |
| | | | 257/21 |
| 2013/0250421 A1* | 9/2013 | Wakabayashi | G02B 5/3025 |
| | | | 359/576 |
| 2014/0106553 A1* | 4/2014 | Egard | H01L 29/42316 |
| | | | 438/585 |
| 2014/0291715 A1* | 10/2014 | Reiherzer | H01L 33/60 |
| | | | 257/98 |
| 2015/0115221 A1* | 4/2015 | Nagel | H01L 33/44 |
| | | | 257/13 |

OTHER PUBLICATIONS

U.S. Appl. No. 61/951,411, filed Mar. 11, 2014, Miller.

* cited by examiner

FRONT-SIDE EMITTING MID-INFRARED LIGHT EMITTING DIODE FABRICATION METHODS

CROSS-REFERENCE TO RELATED APPLICATIONS

This application claims priority to and the benefit of U.S. Provisional Application Ser. No. 61/951,411, entitled "Front-side Emitting Mid-Infrared Light Emitting Diode Fabrication Methods," filed on Mar. 11, 2014, which application is incorporated by reference in its entirety herein.

BACKGROUND OF THE INVENTION

1. Technical Field

The embodiments disclosed herein are related to the field of manufacturing light emitting diode (LED) devices.

2. Background and Relevant Art

Unless otherwise indicated herein, the materials described in this section are not prior art to the claims in this application and are not admitted to be prior art by inclusion in this section. The use of the term "background" is inclusive of the term "context." Thus, the following section provides both context for the disclosure and may also provide patentable support for the claims.

The use of doped semiconductors to create barriers, injectors, tunnel junction contacts, cascade LED junctions, and other related devices has long been known in the art. Specially, conventional semiconductor materials can be comprised of doped semiconductor layers placed into contact with each other to create one or more p-n junctions. In the case of light emitting diodes (LEDs), as electrical current is applied to the junctions, electrons and holes combine with each other and emit photons. The energy contained in the emitted photons corresponds to the energy difference between the respective holes and electrons.

Conventional LED device dies have dimensions around one millimeter square and a tenth of a millimeter thick. The die substrates have thin semiconductor heterostructure layers on one side, with the layers patterned by lithography for making electrical contact. Forcing an electrical current through the heterostructure layers can convert electrical power to optical power. Light generated within the heterostructures can be extracted from a die with combinations of surface features and coatings, such that light can escape which would otherwise be mostly confined to the die because of total internal reflection.

Several conventional semiconductor device fabrication methods have been developed for high-brightness and other format LEDs that operate at particular wavelengths in several optical wavelength ranges, including the ultraviolet, visible, and near-infrared ranges. A conventional LED fabrication method typically includes several processes and procedures. First, the fabrication process can include processes for the epitaxial growth of light emitting and other semiconductor layers on a substrate. Second, the fabrication can include a process for lithographically patterning the epitaxial and other layers to define electrical contacts. Third, the fabrication can include a process for adding optical layers and features for light extraction. Fourth, the fabrication can include a process for configuring the device die for packaging. Fifth, the fabrication can include a process for then packaging die by attaching and bonding the die for electrical contact and thermal heat sinking. One will understand that the processes described above are merely exemplary and that other embodiments may comprise additional, fewer, or different process steps.

Conventional LEDs operating in different wavelength ranges are based on different semiconductor material systems. These conventional LEDs typically require different corresponding chemical fabrication processes as well as particular supporting metal and dielectric materials combinations compatible with the respective semiconductor materials. Due to limitations in the current art, conventional fabrication methods cannot be applied to a semiconductor material system that spans the mid-infrared wavelength range.

Accordingly, there are a number of improvements that can be made within the art.

BRIEF SUMMARY

Embodiments of the present invention comprise systems, methods, and apparatus configured to manufacture mid-infrared LEDs. In particular, embodiments of the present invention comprise manufacturing processes for creating mid-infrared high-brightness LEDs that are configured to take advantage of one or more existing support technologies. Additionally, embodiments of the present invention provide unique and novel manufacturing techniques for LED devices.

Embodiments of the present invention include methods for fabricating mid-infrared light emitting diodes (LEDs) based upon antimonide-arsenide semiconductor heterostructures and configured into front-side emitting high-brightness LED die and other LED die formats. The methods may include growing cascaded light emission stages configured for double-heterostructure confinement with superlattice electron and hole injectors. The frontside lithographic fabrication methods may include etching dielectric light extraction features, configuring metal layer structures for wire bonding, current spreading, and ohmic contact formation. The backside fabrication methods may include substrate thinning and polishing and then coating the surface with a metal layer sequence which simultaneously forms an internal mirror, an ohmic contact, and a final surface suitable for either eutectic solder or conducting epoxy die attachment. The finished die can be attached to LED packages and wire bonded.

Additional features and advantages of exemplary implementations of the invention will be set forth in the description which follows, and in part will be obvious from the description, or may be learned by the practice of such exemplary implementations. The features and advantages of such implementations may be realized and obtained by means of the instruments and combinations particularly pointed out in the appended claims. These and other features will become more fully apparent from the following description and appended claims, or may be learned by the practice of such exemplary implementations as set forth hereinafter.

BRIEF DESCRIPTION OF THE DRAWINGS

In order to describe the manner in which the above recited and other advantages and features of the invention can be obtained, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

Figure 1B:
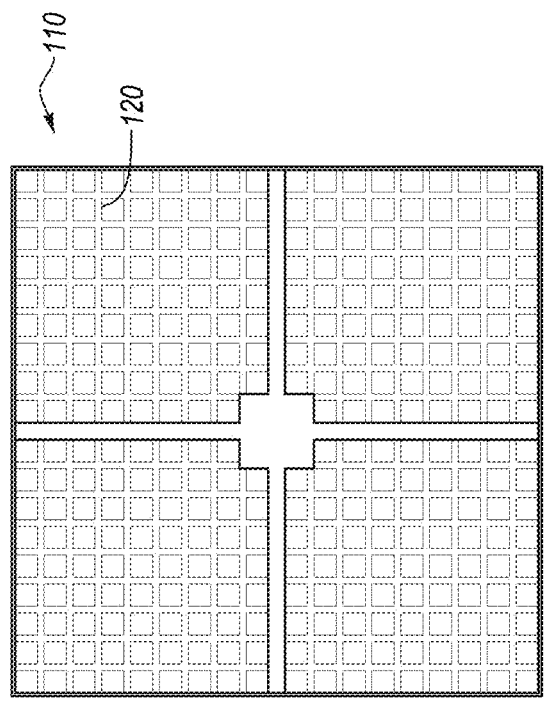
FIG. 1B illustrates a surface view of an LED in accordance with embodiments of the present invention.

The present invention extends to systems, methods, and apparatus configured to manufacture mid-infrared LEDs. In particular, embodiments of the present invention comprise manufacturing processes for creating mid-infrared high-brightness LEDs that are configured to take advantage of one or more existing support technologies. Additionally, embodiments of the present invention provide unique and novel manufacturing techniques for LED devices.

Antimonide-arsenide semiconductor heterostructures may have properties suitable for light emission at wavelengths across the mid-infrared wavelength range, including wavelengths from about 3 to 20 μm. There are, however, no complete methods that bring together and adapt fabrication process procedures for front-side emitting antimonide-arsenide LEDs corresponding to the methods for fabricating high-brightness and other format LEDs using other materials for operation in other wavelength ranges.

Methods for fabricating front-surface emitting LEDs based upon antimonide-arsenide semiconductor heterostructures for operation across the mid-infrared wavelength spectrum would produce devices suitable for widespread use in many applications. However, the fabrication methods established for other LEDs based upon other semiconductor materials operating at other wavelength ranges cannot be directly applied to antimonide-arsenide heterostructure LEDs. Similarly, the processing procedures available for antimonide-arsenide semiconductor devices have not been combined and developed into a method for fabricating corresponding mid-infrared antimonide-arsenide LED devices.

The methods disclosed herein are for fabricating mid-infrared LED devices based at least upon antimonide-arsenide semiconductor heterostructures. In particular, embodiments of the present invention provide compatible fabrication process steps for manufacturing front-surface emitting LED device die, which emit light with wavelengths in the range of about 3 μm to 20 μm and which can be attached and bonded to typical high-brightness format LED packages and other format LED packages.

Technical problems arise in manufacturing front-side facing mid-infrared LEDs due to fundamental differences in conventional manufacturing processes. For example, conventional manufacturing processes have developed for devices operating at other wavelength ranges and thus upon other semiconductor, supporting metal, and dielectric materials. Because of the differences in semiconductor chemical and material properties, these manufacturing processes cannot be directly applied to LEDs fabricated using antimonide-arsenide heterostructures.

Additionally, conventional technical problems also arise in part because a method has not been developed for combining compatible fabrication process steps into a method for fabricating antimonide-arsenide heterostructures LED die suitable for front-surface emitting devices configured for attaching and bonding to high-brightness and other standard format LED packages.

Embodiments of the present invention comprise several particular fabrication process steps that can be developed and combined in a mutually compatible manner with one another to solve the general problem of finding a method to fabricate a front-side emitting antimonide-arsenide semiconductor-based mid-infrared LED. For example, in at least one embodiment, various processes and method are provided that overcome shortcomings within the conventional manufacturing process.

For instance, embodiments of the present invention provide systems where epitaxial antimonide-arsenide heterostructures can be grown on the frontside of a substrate in a configuration consistent with the optical, electrical, packaging, and other fabrication steps. Additionally, optical output coupling dielectric structures on the front side for light extraction can be fabricated with layer deposition, lithographic patterning, and etching. Further, frontside current spreading, ohmic contacting, and wire bonding structures can be fabricated with deposition and lithography.

Additionally, embodiments of the present invention provide for a thin, low-optical absorption substrate with a backside internally-reflective mirror. Embodiments of the present invention also provide heterostructure edges, which define the device active areas that can be chemically and electrically passivated for device stability and for avoiding surface leakage currents. Addition embodiments comprise backside metal layers suitable for internal optical reflection, ohmic contacting to the substrate, and eutectic or conducting epoxy die attach need to be applied. Further, embodiments of the present invention comprise methods for configuring the finished LED die for attaching and wire bonding in typical LED packages.

Figure 1A:
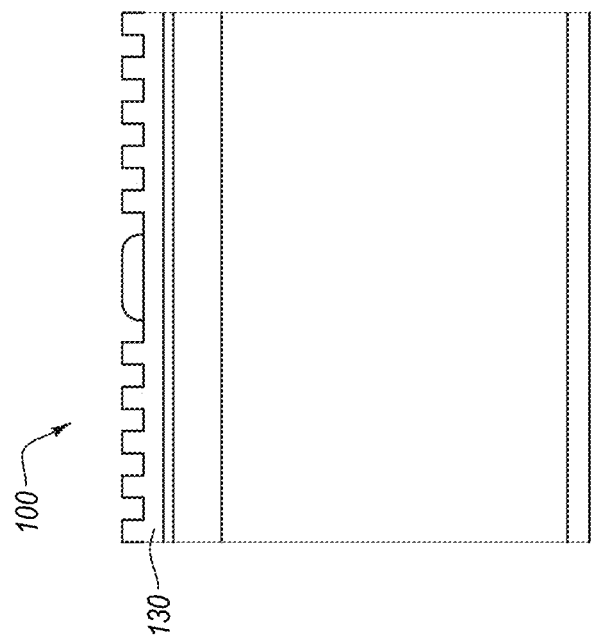
FIG. 1A illustrates a cross-sectional view of a die in accordance with embodiments of the present invention.

For example, FIGS. 1A and 1B respectively depict a die cross-sectional diagram 100 and a top-surface layout 110 with etched dielectric butte output couplers 220. In at least one embodiment, the buttes 120 may be 2 μm wide, 1 μm high GaSb buttes etched in the contact metal mesh openings. The coupling buttes 120 can be etched into an epitaxial GaSb layer, stopping on an n-type InAs layer 130. The InAs layer 130 is contacted with a typical Ti/Pt/Au ohmic metallization that also serves for the current spreading and wire-bonding layer. As shown in FIG. 1B, in at least one embodiment, the active emission layers and coupling buttes 120 cover the entire front surface, and the current spreading pattern mitigates in-plane potential drops across the device.

Figure 2:
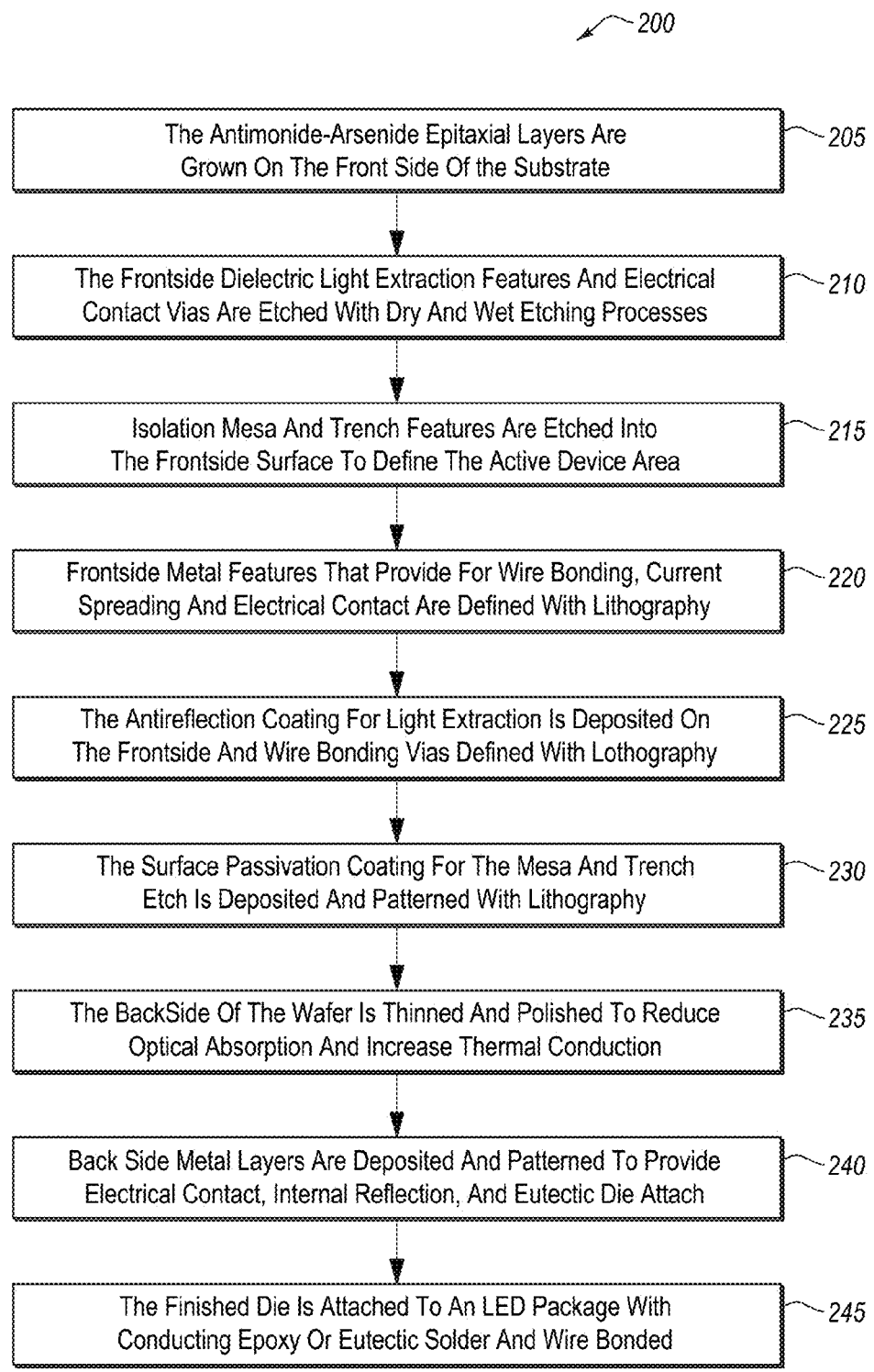
FIG. 2 depicts a flowchart of steps in a method in accordance with embodiments of the present invention.

Accordingly, the embodiments disclosed herein provide methods for fabricating frontside emitting, antimonide-arsenide based, mid-infrared LED devices. For example, the diagram 200 displayed in FIG. 2 illustrates an embodiment of a flow of fabrication processes. In general, the embodiment includes the growth of the epitaxial antimonide-arsenide light emitting heterostructures, the frontside lithographic processing, and the backside processing and packaging.

Additionally, the embodiments include methods to fabricate devices with various output wavelengths that span the mid-infrared, with wavelengths ranging from about 3 to 20 µm. In at least one embodiment, LEDs can be designed to emit particular wavelengths of light by making small adjustments to the processes for fabricating the antimonide-arsenide semiconductor heterostructures. For example, a designer can make slight changes to layer thicknesses.

Similarly, a designer can make small adjustments to the processes for fabricating the light-extraction buttes. For instance, the designer can change the butte sizes on the surface. The designer can also make changes to the anti-reflection coating process, in which the deposited layer thicknesses are changed and the composition adjusted for different wavelengths. Embodiments of the other processes, including those for fabricating the mechanical, electrical, optical, and packaging features and structures, otherwise have essentially the same steps and conditions for different antimonide-arsenide mid-infrared LEDs operating at different wavelengths.

Turning now to the epitaxial growth of antimonide-arsenide heterostructures (step 205). Embodiments of the present invention include the processes for growing a sequence of antimonide-arsenide semiconductor heterostructure layers on the front side of a low-optical absorption n-type gallium antimonide ("GaSb") wafer. The growth procedure can include depositing variable-period superlattices of indium arsenide ("InAs"), gallium arsenide ("GaAs"), Aluminium Antimonide ("AlSb") and related alloys, which are strain-balanced, at several intervals in the overall deposition and growth sequence.

The growth of the first variable period superlattice provides electrical contact between the substrate and the first emission stage. The emission stages can be grown as layer sequences of InAs, GaSb, AlSb and related alloys, which form either superlattice or quantum well light emission structures. The layer sequences can also be clad with variable-period superlattices that form double-heterostructure confinement barriers and carrier injectors. In at least one embodiment, several periods of emission stages are grown, cascaded by tunneling junctions formed by growing layers of InAs and GaSb, or closely related alloys.

The growth of the last variable period superlattices can provide electrical contact between the last emission stage and the current spreading InAs, or closely related alloy, layer. In step 210, the final layer growths can include a thicker GaSb layer, which will be etched to form the light-extraction surface features and which is in tunneling contact with the current spreading InAs, or closely related alloy, layer. Other embodiments of the methods include frontside lithographic processing to form structures for light extraction, electrical current injection, and surface passivation.

The process flow of FIG. 2 includes one or more steps illustrating a frontside fabrication processes. In at least one embodiment, the topmost GaSb layer is lithographically patterned to form weakly-coupled buttes for light extraction. The topmost GaSb layer is also lithographically patterned to form contact vias to the underlying current spreading InAs, or closely related alloy.

The lithographic process can use a sequence of dry etching and wet etching processes. In at least one embodiment, dry etching can be used for most of the etch depth in order to obtain an anisotropic etch profile. The remainder of the GaSb material may be removed by wet etching that is chemically selective and stops on the current spreading InAs, or closely related alloy, layer. At least one embodiment includes visually detecting and confirming the endpoint of the GaSb etch by observing the color change of the surface with the final GaSb removal.

Subsequently, in step 215, in at least one embodiment, the active regions of the device can be patterned with lithography and dry etching of mesa and trench geometries to a depth that goes completely through the stack of cascaded heterostructure light emission stages. In step 220, the frontside metal structures can then be deposited and patterned by lithography for providing an ohmic contact to the current spreading InAs, or closely related alloy, layer; for providing wire bonding pads; and for providing metal features for front surface current spreading.

Further embodiments of the frontside processing methods include step 225 and 230 of the deposition and lithographic patterning of the anti-reflection coating and passivation layers for the exposed heterostructure edges. The antireflection coating processing may entail depositing a dielectric layer transparent to the LED operation wavelength on the front surface with a thickness adjusted to extract the maximum amount of light. The antireflection coating processing may further comprise using lithography to open vias for wire bonding and surface passivation as needed.

In at least one embodiment, the surface passivation processing entails etching the exposed edges of the heterostructures layers to remove the oxide and unintentional conducting layers and chemically treating the surface to avoid forming new conducting layers. The surface passivation process can also include depositing a passivating and insulating dielectric layer and then using lithography to open vias for wire bonding as needed.

A further embodiment of the process to fabricate an antireflection coating and a surface passivation layer entails accomplishing both functions with a single deposited layer sequence. The processing can include etching the exposed edges of the heterostructures layers to remove the oxide and unintentional conducting layers, chemically treating the surface to avoid forming new conducting layers, depositing a sequence of layers which serve as both an anti-reflection coating and a passivating and insulating dielectric layer, and then using lithography to open vias for wire bonding as needed.

Other embodiments of the methods include backside lithographic processing to form structures for an internal mirror, electrical contacting, and LED packaging. Additionally, embodiments of the methods include LED packaging processes. The process flow of FIG. 2 includes one or more steps illustrating a backside fabrication and packaging processes.

In at least one embodiment, as indicated by step 235, the backside of the substrate is thinned to reduce mid-infrared light absorption in the substrate and to increase thermal conduction through the substrate. Additionally, as indicated by step 240, the backside can be polished to provide a reflective surface for an internally reflecting mirror. Subsequently, a sequence of metal layers can be deposited on the backside. The metal layers can together provide for an internal mirror and for electrical contact to the substrate. Additionally, the metal layers can provide for eutectic bonding to an LED package and for diffusion barriers with the metal stack to keep other metal layers separate as needed.

In at least one embodiment, the first metal reacts with the GaSb substrate to form an electrical contact. The next layers can act as reaction and diffusion barriers to limit the extent of the reaction with the GaSb substrate and to prevent gold ("Au") diffusion into the substrate, which is followed by a current carrying Au layer. Metal layers for packaging can then be deposited, beginning with a nickel ("Ni") diffusion barrier and followed by a layer to be consumed in the eutectic bond formation for die attach. The deposited metals can then be annealed as needed to complete the electrical contact forming reaction. In step 245, finished die are attached to the LED package using either a eutectic solder process or a conducting epoxy process. Finally, metal bonding wires are bonded to the frontside metal bond pads.

Accordingly, embodiments of this invention provide methods for fabricating a new class of mid-infrared LEDs with wavelengths from about 3 to 20 μm, based on cascaded antimonide-arsenide light-emitting heterostructures. In particular, the fabrication method embodiments accommodate the ability to make specific changes in some heterostructure layer thicknesses and specific adjustments to light extraction surface feature sizes to give mid-infrared LED devices of different wavelengths.

Additionally, the embodiments disclosed herein adapt the properties of antimonide-arsenide heterostructure fabrication process methods to the requirements for compatibility with the more general high-brightness LED technology. Some of the embodiments provide for mid-infrared LED die which are compatible with other high-brightness LED packaging. Additionally, some of the embodiments provide for mid-infrared LED die which are compatible with the electrical drive and control circuitry and systems employed for other high-brightness LEDs. Further, some of the embodiments provide for mid-infrared LED die which are compatible with the heat management dissipation and systems employed for other high-brightness LEDs. Several of the embodiments also combine to provide for other mid-infrared LED device formats, such as lower power devices or higher modulation frequency devices.

The new class of mid-infrared LED devices fabricated with these methods, including the high-brightness formats and other formats, should enable several new uses. For example, mid-infrared LEDs operating at various wavelengths will be useful for detecting chemical and biological substances and concentrations. Mid-infrared LEDs configured for high modulation frequencies should be useful for new communication links in this range of the electromagnetic spectrum. High-brightness mid-infrared LEDs can also function as a new class of illuminators for night vision and thermal imaging sensors and cameras operating in the mid-infrared portion of the electromagnetic spectrum.

Figure 3:
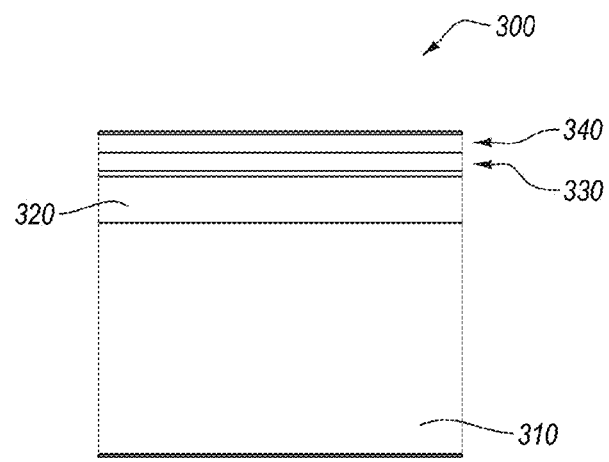
FIG. 3 illustrates a cross-sectional view of an LED in accordance with embodiments of the present invention.

The diagram of FIG. 3 illustrates an embodiment of the principal epitaxial layers 300 to be grown on the low-optical absorption n-GaSb substrate 310 by molecular beam epitaxy (MBE). In at least one embodiment, the heterostructure growth can begin with a strain-balanced, variable-period superlattice 320 comprised of InAs and GaSb layers all doped with tellurium ("Te") to provide electrical contact between the substrate and the light emitting first stage and to provide a hole-barrier as the first half of the double-heterostructure confinement structure. In this embodiment the growth continues with light emitting layers that are strain-balanced superlattices with uniform layer thicknesses of 6.5 monolayers of InAs and 7.0 monolayers GaSb, having a total thickness of 24 periods. The first stage growth can continue with a variable period superlattice that provides for a hole injector into the light emitting layers and an electron barrier to complete the double-heterostructure confinement configuration.

The first stage growth can complete with the growth of a 50 nm GaSb layer doped with silicon ("Si") which serves as an electron barrier and the p-side of the tunneling contact to the next stage. In beginning the growth of the next stage, the first layer can comprise a 6 nm InAs layer also doped with Si to form the n-side of the tunneling junction. The tunneling junction benefits from the use of the amphoteric Si dopant properties, requiring only one dopant for the junction, and benefits from the use of the low diffusivity of Si to maintain the desired doping profile.

The second stage can then be grown, beginning with variable-period superlattice comprised of InAs and GaSb layers all doped with Te to provide electrical contact between the tunnel junction and the light emitting first stage and to provide a hole-barrier as the first half of the double-heterostructure confinement structure. In this embodiment, the growth can continue with light emitting layers that are strain-balanced superlattices with uniform layer thicknesses of 6.5 monolayers of InAs and 7.0 monolayers GaSb, having a total thickness of 24 periods. The second stage growth can complete with the growth of a 50 nm GaSb layer doped with Si which serves as an electron barrier and the p-side of the tunneling contact to the next stage. The subsequent 10 stages can then be grown identically to the second stage.

After the last stage, a 20 nm InAs contact and current spreading layer 330, doped with Si, can be grown. Then the current spreading InAs layer can be capped with a 1 μm thick GaSb layer 340 which is doped with Si in the first 10 nm to provide a tunneling contact to the InAs current spreading layer and doped with Si in the last 10 nm to provide for an ohmic surface contact.

Figure 4:
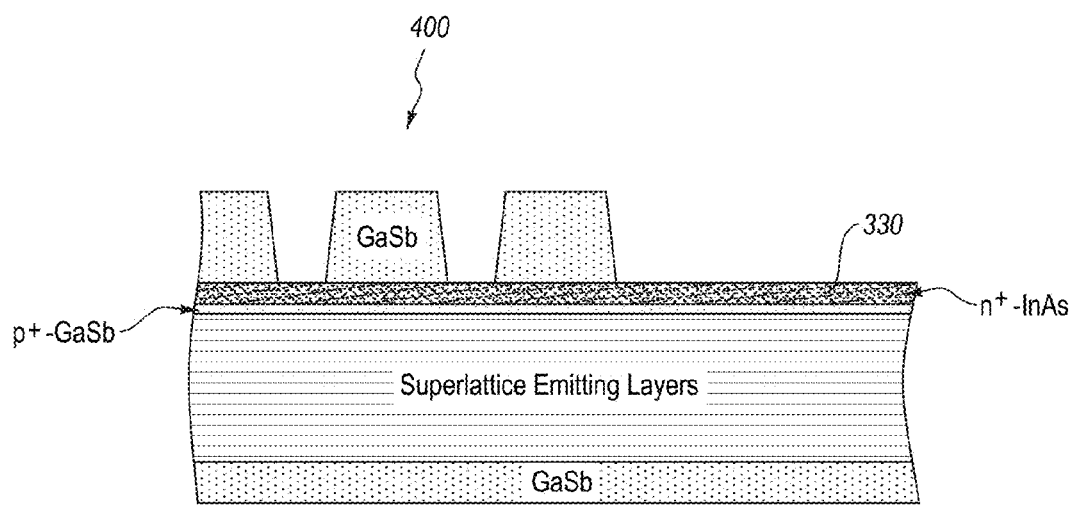
FIG. 4 illustrates a cross-sectional view of a portion of an LED in accordance with embodiments of the present invention.

The diagram of FIG. 4 illustrates an embodiment of an end point of the etching processes to form the weakly-coupled dielectric light extraction buttes 400 and to expose the underlying InAs current spreading layer 330 for ohmic contact formation. In at least one embodiment, the light extraction and contact via geometries are defined by optical lithography. The butte and contact via etching can begin with a Chlorine ("Cl")-based dry etch process to remove most of the material while maintaining a nearly vertical anisotropic etch profile, in this particular case etching approximately 900 nm.

Figure 5:
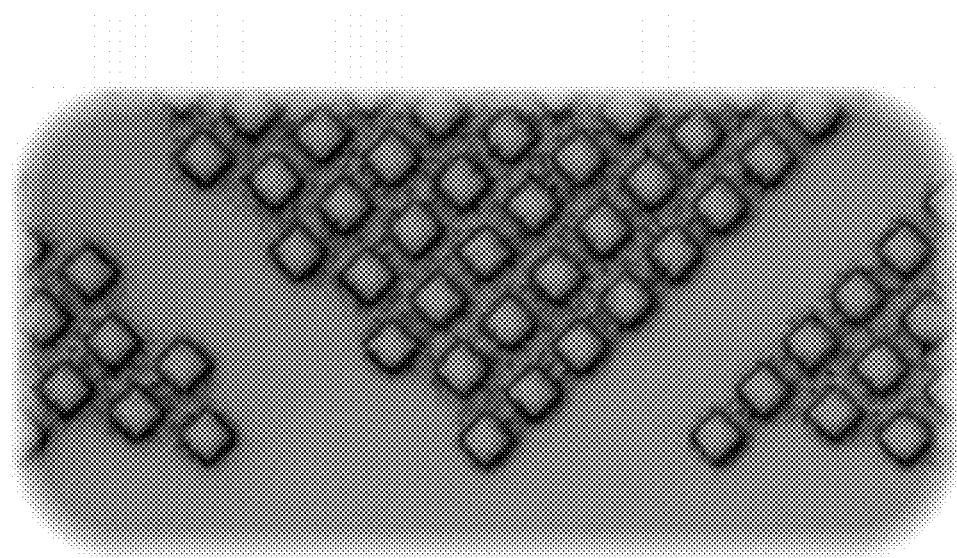
FIG. 5 illustrates an optical microgram of an extraction buttes in accordance with embodiments of the present invention.

The dry etch can be followed by a wet etch, in this case an ammonium hydroxide-based aqueous solution. The endpoint of the wet etch process can be detected and confirmed by the abrupt color change of the surface as the final remnants of the GaSb are removed. The optical micrograph in FIG. 5 depicts a surface of a 4.25 μm wavelength LED that includes the 2 μm wide, 1 μm high GaSb buttes. The color of the exposed InAs is sharply distinct from that of the GaSb.

In at least one embodiment, the active area of the LED device can be defined by optical lithography to etch isolation mesas and trenches. The etch may be accomplished with a Cl-based dry etch process. The dry etch depth can reach through the entire stack of light emitting heterostructure stages. After the dry etch, a brief wet etch can be performed to remove surface damage.

Figure 6:
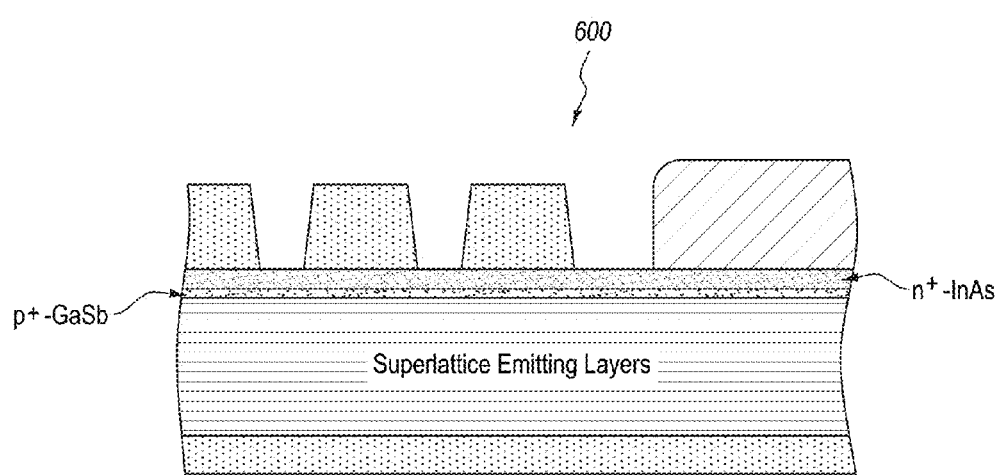
FIG. 6 illustrates a cross-sectional view of a portion of an LED in accordance with embodiments of the present invention.
Figure 7:
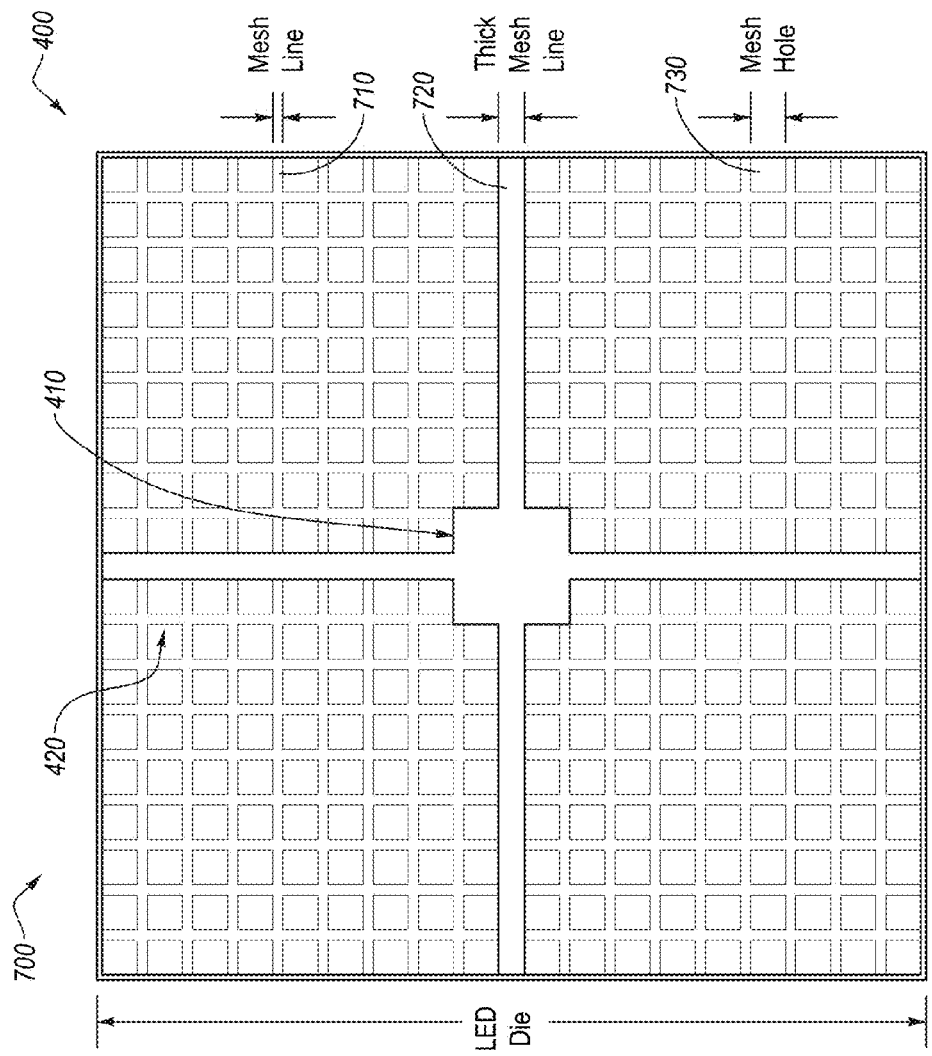
FIG. 7 illustrates a metal mesh for an LED in accordance with embodiments of the present invention.

FIG. 6 depicts a cross-sectional diagram of an embodiment of the deposited and patterned frontside metal layers 600. The geometry of the metal patterns may be defined and developed with a lift-off lithographic process. Additionally, the metal pattern may comprise mesh lines of different sizes. For example, FIG. 7 depicts an exemplary metal mesh layer 700. In at least one embodiment, fine mesh lines 710 can be approximately 5 µm wide and 1 µm thick, while thick mesh lines 720 can be approximately 20 µm wide and 1 µm thick. In at least one implementation, the mesh openings 730 are approximately 50 µm across.

The metal layer deposition can begin with a 5 nm titanium ("Ti") layer for adhesion to the InAs contacting and current spreading layer. Subsequently, a 20 nm platinum ("Pt") layer can be deposited to serve as an Au diffusion barrier. Finally, a 1 µm Au layer can be deposited for current carrying and wire bonding. The optical micrograph in FIG. 5 of the surface of the 4.25 µm wavelength LED includes a portion of the metal mesh current spreading contact structure.

Figure 8:
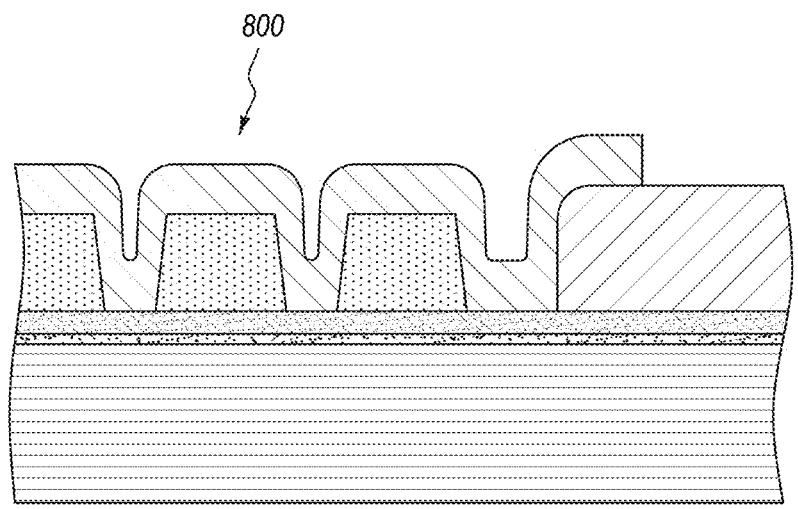
FIG. 8 illustrates a cross-sectional view of a portion of an LED in accordance with embodiments of the present invention.

FIG. 8 depicts a cross sectional view of an embodiment of LED surface features which include the anti-reflection coating 800 applied to the surface for light extraction. The geometry of the dielectric coating patterns are defined and developed with a lift-off lithographic process, where the principal features to be defined include bonding vias on the wire bonding pads and the heterostructure sidewalls that will be passivated separately. A silicon monoxide-based anti-reflection coating can be deposited at a thickness of 550 nm, which is designed for 4.25 µm wavelength light extraction. The anti-reflection coating can also serve as a surface passivation layer. The optical micrograph in FIG. 5 of the surface of the 4.25 µm wavelength LED shows a portion of the frontside with the antireflection coating.

In at least one embodiment, a further surface treatment and deposition process provides additional surface passivation coating for the edges of the heterostructure light emission layers which were exposed by the mesa and trench etch. The exposed heterostructure edges can be treated to remove surface oxides and antimony and arsenic layers and to prevent further oxidation. Subsequently, the surface can be coated with a protective dielectric layer and the lithographic lift off completed.

Additionally, in at least one embodiment, a designer can thin and polish the substrate to reduce optical absorption in the substrate, improve the thermal conduction to the package, and to provide for a smooth internally-reflective surface. For example, within a 4.25 µm wavelength LED, the substrate may be lapped to a thickness of approximately 50 µm before polishing.

Figure 9:
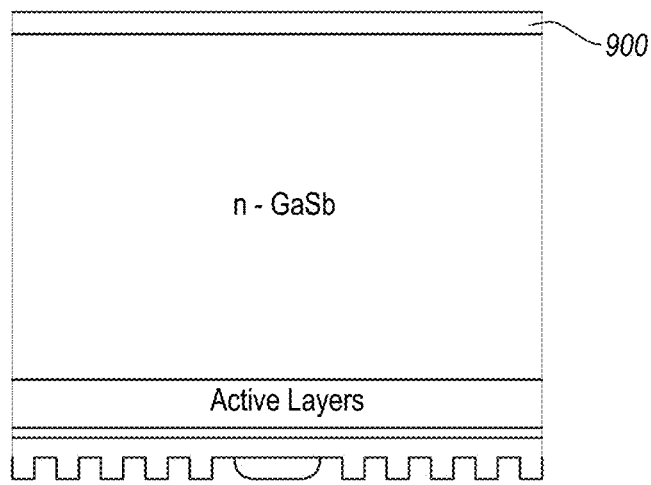
FIG. 9 illustrates a cross-sectional view of a die in accordance with embodiments of the present invention.

A series of metals can then be deposited on the backside of the thinned wafer to provide for an internally reflective mirror, form an ohmic contact to the substrate, and finish with a surface which is suitable for die attach with either eutectic solder or a conducting epoxy. FIG. 9 depicts a cross-sectional diagram of an embodiment of an LED substrate after backside metal deposition 900.

In at least one embodiment, the backside metal layer depositions begin with a 20 nm palladium ("Pd") layer in contact with the n-GaSb, which reacts with the GaSb to form an intermetallic ohmic contact. The Pd can be covered with a 20 nm Ti layer to limit the reaction extent of the Pd—GaSb. The Pd can also be covered with a 20 nm Pt layer to serve as a diffusion barrier for subsequent Au layers. A 500 nm Au layer is then deposited on the Pt. To form the structure for an Au:Sn ("gold:tin")::80:20 eutectic packaging bond. The Au layer can be capped with a 100 nm eutectic diffusion barrier of Ni, followed by a 200 nm Au layer to be consumed in the eutectic bond.

Figure 10:
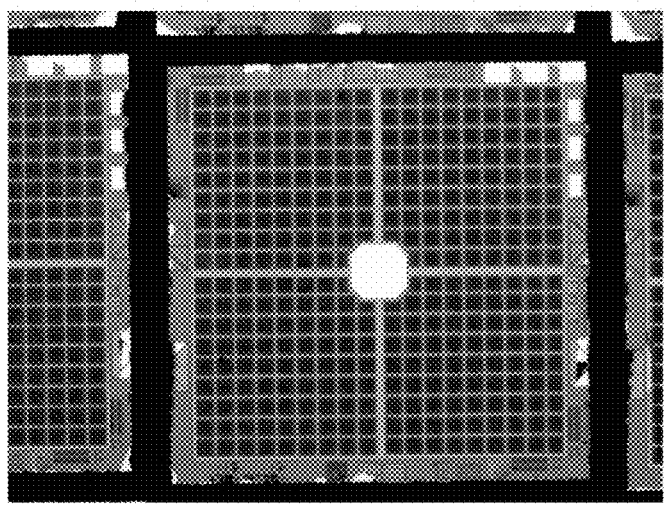
FIG. 10 illustrates an optical microgram of a finished die in accordance with embodiments of the present invention.
Figure 11:
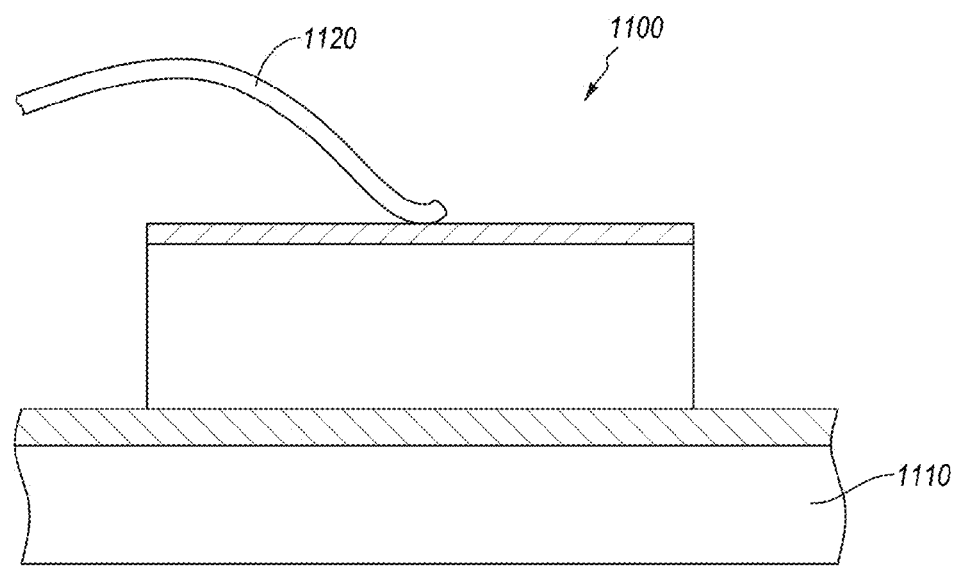
FIG. 11 illustrates a die bonding and packaging example for an LED in accordance with embodiments of the present invention.
Figure 12:
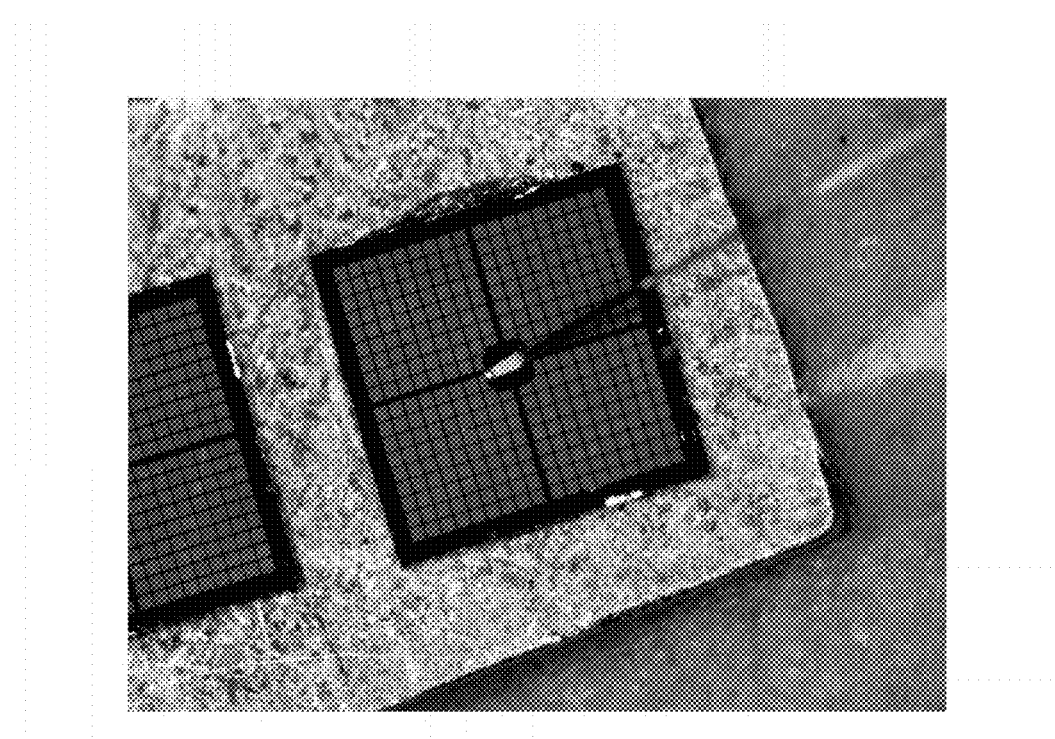
FIG. 12 illustrates an image of a complete LED in accordance with embodiments of the present invention.

In at least one embodiment, after the backside metallization, the die are singulated by either dicing or cleaving. For example, FIG. 10 displays an optical micrograph of diced 4.25 µm wavelength LED die. Die can then be attached to an LED package with a Au:Sn::80:20 eutectic solder or a conducting epoxy, and the frontside bonding pad bonded with an Au or Al bonding wire. For example, FIG. 11 displays a cross-sectional diagram of a finished LED die 1100 attached to an LED package 1110 with an Au:Sn::80:20 eutectic solder and a single frontside wire bond 1120. Similarly, FIG. 12 displays an optical micrograph of a finished 4.25 µm wavelength LED die attached to an LED package with conducting epoxy and wire bonded with a single bond wire to the central bond pad.

In at least one embodiment, a fabrication method for a 8.3 µm emission wavelength LED is largely similar to that for the 4.25 µm emission wavelength LED described in the previous section, with four principle adjustments to the embodiment method. For example, the heterostructure growth may include light emitting layers that are strain-balanced superlattices with uniform layer thicknesses of 8.0 monolayers of InAs and 7.0 monolayers GaSb, having a total thickness of 22 periods. Additionally, in at least one embodiment, the growth of the electron and hole injector graded superlattices in the double heterostructure confinement light emission stages have slight adjustments in their spatially graded periods to accommodate the band edges of the 8.3 µm wavelength emission superlattice. Additionally, the final GaSb layer on the top can be grown to a thickness of 2.0 µm. The light extraction buttes for the 8.3 µm emission wavelength LED can be defined by lithography and etched to have heights of approximately 2 µm and widths of 4 µm.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for manufacturing a mid-infrared LED, the method comprising:

forming an electrical contact between a substrate and a first light emission stage using variable-period superlattices;

forming first and subsequent light emission stages to have double-heterostructure confinement configurations, with variable period semiconductor superlattices forming one or more charge injectors and minority carrier barriers;

forming cascaded light emission stages by forming semi-metallic tunneling junctions between light emission stages using a junction between layers of GaSb and InAs doped with Si on both sides of the junction;

growing strain-balanced superlattices and heterostructures;

forming an electrical contact between a topmost light emission stage and an InAs current-spreading and ohmic contact layer using variable-period superlattices; and growing a layer of GaSb for etching light-extraction surface features.

2. The method of claim 1 further comprising growing light emission layers comprised of superlattice structures, where the thicknesses of the superlattice layers are adjusted to determine the light emission wavelength.

3. The method of claim 1 further comprising growing light emission layers comprised of quantum well structures, where the thicknesses of the quantum well and barrier layers are adjusted to determine the light emission wavelength.

4. The method of claim 1 further comprising:
etching light extraction surface features and electrical contact vias to an InAs current spreading layer into a topmost layer of GaSb;
defining a geometry of weakly-coupled surface buttes using photolithography, with butte size and spacing adjusted to accommodate efficient light extraction at wavelengths of one or more light emission layers;
etching through most of a topmost epitaxial layer of GaSb using a dry plasma-based etch with a Cl-based etch gas mixture; and
completing the etch through a last portion of an epitaxial layer of GaSb using a chemically-selective wet etch based upon an ammonium hydroxide solution chosen to selectively stop etching on the underlying InAs electrical contact layer.

5. The method of claim 1 further comprising:
etching light extraction surface features and electrical contact vias to an InAs current spreading layer into a topmost layer of GaSb;
completing the etch through a last portion of the epitaxial layer of GaSb using a chemically-selective wet etch based upon an ammonium hydroxide solution chosen to selectively stop etching on an underlying InAs electrical contact layer; and
optically or visually detecting an endpoint of the wet etch by observing an etching surface color change as final remnants of GaSb are etched from the surface to expose underlying InAs.

6. The method of claim 1 further comprising:
etching mesa and trench features through cascaded light emission stages to define and electrically isolate an active device area;
defining a geometry of the active device area using photolithography;
etching through cascaded active heterostructure layers using a dry plasma-based etch with a Cl-based etch gas mixture; and
etching dry-etched surfaces with hydrogen chloride or ammonium hydroxide based aqueous solutions to remove surface damage from dry etching.

7. The method of claim 1 further comprising:
defining a metal contact and wire bond pad geometries using photolithography;
depositing a sequence of metal layers on an exposed InAs current spreading layer that include an adhesion layer, a layer of Pt as an Au diffusion barrier, and a layer of Au that is thicker than the Pt layer for conducting current across the device and providing a wire bond pad metal; and
forming a final pattern by lifting off unwanted metal.

8. The method of claim 1 further comprising:
defining regions to not be covered with an anti-reflection coating using photolithography;
depositing a sequence of dielectric layers with compositions and thicknesses matched to operating wavelengths of the light emission superlattices; and
forming a final pattern by lifting off unwanted dielectric material.

9. The method of claim 1 further comprising:
defining regions to not be covered with surface passivation layers using photolithography;
treating one or more exposed heterostructure surfaces and other regions by etching a surface oxide with an aqueous solution;
depositing a sequence of layers to passivate a treated surface; and
forming a final pattern by either lifting off or etching unwanted passivation material.

10. The method of claim 1 further comprising:
defining regions to not be covered with surface passivation layers and an antireflection coating using photolithography;
treating exposed heterostructure surfaces and other regions by etching a surface oxide with an aqueous solution;
depositing a sequence of layers which both passivate a treated surface and provide for an antireflection coating; and
forming a final pattern by either lifting off or etching the unwanted passivation and antireflection material.

11. The method of claim 1 further comprising:
lapping or grinding a substrate to approximately 50 μm or less, and
polishing a surface of the substrate to give a smooth surface for forming an internally-reflecting mirror.

12. The method of claim 1 further comprising:
defining one or more coverage geometries using photolithography;
depositing a sequence of metal layers on an exposed GaSb substrate that include a layer of Pd for reacting with the GaSb to form an electrical contact, followed by a layer of Ti as a diffusion barrier for an intermetallic reaction layer barrier, a layer of Pt as an Au diffusion barrier;
depositing a further sequence of metal layers on a Pt surface that include a layer of Pt as an Au diffusion barrier, and a thicker layer of Au for conducting current;
depositing a further sequence of metal layers on an Au surface that include a layer of Ni as a eutectic reaction barrier and a thicker layer of metal or metal alloy for forming a eutectic die attach packaging bond;
forming a final pattern by lifting off unwanted metal; and
annealing deposited metals to complete a Pd—GaSb reaction.

13. The method of claim 1 further comprising:
attaching a die to a package using an Au:Sn eutectic solder or a conducting epoxy; and
bonding at least one top bonding pad with at least one bonding wire.

14. A method to manufacture mid-infrared LED, the method comprising:
defining geometry of weakly-coupled surface buttes using photolithography, with a butte size and a butte spacing adjusted to accommodate efficient light extraction at one or more wavelengths of the light emission layers;
etching through most of a topmost epitaxial layer of GaSb using a dry plasma-based etch with a Cl-based etch gas mixture; and
completing an etch through a last portion of the topmost epitaxial layer of GaSb using a chemically-selective wet etch based upon an ammonium hydroxide solution chosen to selectively stop etching on an underlying InAs electrical contact layer;

defining one or more coverage geometries using photolithography;
depositing a sequence of metal layers on an exposed GaSb substrate that include a layer of Pd for reacting with GaSb to form an electrical contact, followed by a layer of Ti as a diffusion barrier for an intermetallic reaction layer barrier, a layer of Pt as a Au diffusion barrier;
depositing a further sequence of metal layers on a Pt surface that include a layer of Pt as an Au diffusion barrier and a thicker layer of Au for conducting current;
depositing a further sequence of metal layers on an Au surface that include a layer of Ni as a eutectic reaction barrier and a thicker layer of metal or metal alloy for forming a eutectic die attach packaging bond;
forming a final pattern by lifting off unwanted metal; and
annealing deposited metals to complete a Pd—GaSb reaction.

15. The method as recited in claim 14, further comprising:
defining a metal contact and wire bond pad geometries using photolithography;
depositing a sequence of metal layers on an exposed InAs current spreading layer that include an adhesion layer, such as Ti, a layer of Pt as an Au diffusion barrier, and a layer of Au that is thicker than the Pt layer for conducting current across the LED and providing a wire bond pad metal; and
forming a final pattern by lifting off unwanted metal.

16. The method as recited in claim 14, further comprising:
defining regions to not be covered with an anti-reflection coating using photolithography;
depositing a sequence of dielectric layers with compositions and thicknesses matched to one or more operating wavelengths of one or more light emission superlattices; and
forming a final pattern by lifting off unwanted dielectric material.

17. The method as recited in claim 14, further comprising:
defining regions to not be covered with surface passivation layers using photolithography;
treating one or more exposed heterostructure surfaces and other regions by etching a surface oxide with an aqueous solution;
depositing a sequence of layers to passivate a treated surface; and
forming a final pattern by either lifting off or etching unwanted passivation material.

18. The method as recited in claim 14, further comprising:
lapping or grinding at least a portion of a substrate to approximately 50 μm or less, and
polishing a surface of the at least a portion of the substrate to give a smooth surface for forming an internally-reflecting mirror.

19. A method for fabricating a device emitting mid-infrared light, the method comprising:
growing epitaxial crystalline semiconductor device layers by molecular beam epitaxy on a front surface of a semiconductor substrate of GaSb wherein the layers are comprised of InAs, GaAs, or AlSb;
forming strain-balanced heterostructures during molecular beam epitaxial growth that comprise light emitting structures cascaded by tunnel junctions;
lithographically etching dielectric light output coupling surface structures into a topmost GaSb epitaxial layer;
lithographically etching mesas and trenches through the heterostructure layers to define and isolate an active regions of the device;
depositing and lithographically patterning a current-spreading front-surface metal electrical contact structure;
depositing and lithographically patterning a front-side anti-reflection coating on one or more light extraction surface features;
etching surfaces of the heterostructure sidewalls and depositing a chemical and electrical passivation coating;
removing at least some amount of the substrate, to decrease light absorption and increase thermal conduction, and polishing a backside of the substrate for forming a backside internal mirror;
depositing backside metals that form an internal mirror, an electrical contact, and a surface layer for eutectic die attachment; and
attaching a finished die to a light emitting diode package with eutectic solder or conducting epoxy and wire bonding to at least one frontside device bond pad.

20. The method of claim 1, wherein growing a layer of GaSb includes growing alloys of GaSb.

* * * * *